United States Patent [19]

Fraser et al.

[11] Patent Number: 5,173,621

[45] Date of Patent: Dec. 22, 1992

[54] TRANSCEIVER WITH ISOLATED POWER RAILS FOR GROUND BOUNCE REDUCTION

[75] Inventors: Dana Fraser, South Portland; Ray A. Mentzer, Scarborough; Jerry Gray, Cape Elizabeth; Geoff Hannington, South Portland; Susan M. Keown; Gaetan L. Mathieu, both of Portland, all of Me.

[73] Assignee: Fairchild Semiconductor Corporation, Santa Clara, Calif.

[21] Appl. No.: 728,988

[22] Filed: Jul. 12, 1991

Related U.S. Application Data

[60] Division of Ser. No. 243,195, Sep. 8, 1988, Pat. No. 5,065,224, which is a continuation of Ser. No. 880,407, Jun. 30, 1986, abandoned.

[51] Int. Cl.$^5$ .................. H03K 17/16; H03K 19/20
[52] U.S. Cl. .................. 307/443; 307/475; 307/456; 307/542.1
[58] Field of Search .......... 307/443, 456, 475, 455, 307/542, 542.1, 549, 296.4, 296.6

[56] References Cited

U.S. PATENT DOCUMENTS

| | | | |
|---|---|---|---|
| 4,311,927 | 1/1982 | Ferris | 307/456 |
| 4,613,771 | 9/1986 | Gal | 307/455 |
| 4,649,297 | 3/1987 | Vazehgoo | 307/456 |
| 4,654,549 | 3/1987 | Hannington | 307/456 |
| 4,680,613 | 7/1987 | Daniels et al. | 357/70 |
| 4,988,899 | 1/1991 | Jansson | 307/456 |
| 5,034,632 | 7/1991 | Jansson et al. | 307/456 |
| 5,049,763 | 9/1991 | Rogers | 307/443 |
| 5,051,623 | 9/1991 | Yarbrough et al. | 307/454 |

FOREIGN PATENT DOCUMENTS

| | | | |
|---|---|---|---|
| 0090503 | 10/1983 | European Pat. Off. | 357/70 |
| 0214307 | 8/1986 | European Pat. Off. | |
| 57-164548 | 10/1982 | Japan | 357/70 |
| 60-18944 | 1/1985 | Japan | 357/70 |
| 2073947 | 10/1981 | United Kingdom | |
| 2113908 | 7/1983 | United Kingdom | |

OTHER PUBLICATIONS

Patent Abstracts of Japan, vol. 6, No. 103 (E-112)[981] Jun. 12, 1982; & JP-A-57 035361 (Nippon Denki K.K.) Feb. 25, 1982.
Fairchild Camera & Instrument Corp., ECL Data Book, 1977, pp. 2.3-2.4, Mountain View, Calif., US.
Patent Abstracts of Japan, vol. 10, No. 343 (E-456)[2399], Nov. 19, 1986; & JP-A-61 147 559 (NEC Corp.) Jul. 5, 1986.

Primary Examiner—Edward P. Westin
Assistant Examiner—Andrew Sanders
Attorney, Agent, or Firm—David H. Carroll; Lee Patch; James W. Rose

[57] ABSTRACT

Circuit configurations are described for use with split lead leadframes and relatively isolated quiet and noisy power rails to reduce power rail noise and circuit noise. An octal register transceiver circuit incorporates a latch (300) coupled to relatively quiet power rails (42,44) and an output buffer circuit (400) having an input circuit coupled to the latch (300) and relatively quiet power rails (42,44). The output driver transistors (Q433,Q434) of the output buffer circuit (400) are coupled to the relatively noisy output power rails (52,54) to isolate the latch circuit from power rail noise and minimize erroneous operation of the latch. A DC Miller Killer circuit (450) is constructed with delay control components (D456,D457,R460) and an alternative discharge path (R458,D459) to reduce aggravation of power rail noise during operation of DCMK.

4 Claims, 8 Drawing Sheets

TRANSCEIVER WITH ISOLATED POWER RAILS FOR GROUND BOUNCE REDUCTION

This is a division of U.S. Pat. application Ser. No. 243,195, filed Sep. 8, 1988 now U.S. Pat. No. 5,065,224 which is in turn a continuation of U.S. Pat. application Ser. No. 880,407filed Jun. 30, 1986, now abandoned.

BACKGROUND OF THE INVENTION

This invention relates to reducing the effect of transients on integrated circuit operation, and more particularly to reducing on-chip power rail perturbations and the effect of power rail perturbations on the operation of high speed digital integrated circuits.

Power rail perturbation is a transient condition found on the on-chip power distribution lines, most commonly $V_{cc}$ and ground, of certain types of high speed digital integrated circuits. The condition arises during the switching of high current or high power circuits of the integrated circuit, due to the interaction of parasitic inductances with localized power surges. One type of power rail perturbation, ground bounce, occurs when the potential of the internal ground of the device changes relative to system ground. A related condition involving internal $V_{cc}$ is known as $V_{cc}$ squeeze. Ground bounce alone, $V_{cc}$ squeeze alone, or the combination of both cause spurious states and transitions to occur in the switched circuits as well as the other circuits coupled to the switched circuits, thereby corrupting retained data or causing spurious states or transitions to be transmitted in the output.

The major source of parasitic inductance is in the leads of an integrated circuit package. IC package leads commonly are obtained from leadframes such as those illustrated in FIGS. 1 through 4. The plastic dual in-line package (PDIP) leadframe 10 of FIG. 1 includes leads 12a-12x and a tiebar 14 (also known as a paddle support bar) supporting paddle 16. Also illustrated are leadframe rails 2a and 2b, and dambars 4a and 4b. Die 18 is mounted to the paddle 16, and the circuits are connected to the leads 12 with bondwire. For example, internal ground and $V_{cc}$ are connected to respective leads 12l and 12x through bondwires 17 and 19.

Occasionally, a tiebar is connected to supply for pulling charge out of the substrate of the mounted die, which is coupled to the tie bar through the supported paddle. An example of a suitable leadframe is illustrated in FIG. 2. The leadframe of FIG. 2 corresponds to the leadframe 10 of FIG. 1 in all respects but for ground lead 12y, which is integrally coupled to tie bar 14b by lead segment 11.

Occasionally, the paddle of a leadframe is supported by tiebars running to the dambars at the sides of the leadframe, in addition to the tiebars running to the rails at the ends of the leadframe. The practice is common for very large packages such as the 64 lead PDIP package, because end tiebars alone lack sufficient rigidity to adequately support the die throughout the various manufacturing steps. An example is illustrated in FIG. 3. The leadframe of FIG. 3 corresponds to the leadframe 10 of FIG. 1 in all respects but for the addition of tiebars 34a and 34b.

The ceramic dual in-line package (CDIP) leadframe 20 of FIG. 4 includes leads 22a-22x. Ground and power commonly are supplied through leads 22l and 22x respectively. Tiebars and paddles are not used in CDIP leadframes.

Although all leads have some impedance, the impedance longest leads, for example leads 12a, 12l, 12m and 12x of the PDIP leadframe 10; and leads 22a, 22l, 22m and 22x of the CDIP leadframe 20, exhibit the greatest impedance. Unfortunately, by convention the ground and $V_{cc}$ pins are usually placed at corners of an IC package, and must connect to the die through the relatively long hence leads 12l and 12x of the PDIP leadframe 10, and leads 22l and 22x of the CDIP package 20.

Consider the lead model of FIG. 5, which generally represents any lead of an IC package. The lead model includes the self-inductance of the bondwire $L_{bw}$, the lead self-inductance $L_{lf}$, and the lead resistance $R_{lf}$. An abrupt change in the current flowing through the lead 30 will induce a voltage across lead 30 due to $L_{bw}$ and $L_{lf}$ (assuming $R_{lf}$ negligible), in accordance with the expression $$v(t) = (L_{bw} + L_{lf})\frac{di}{dt} \qquad (1)$$

The voltage v(t) also may include components resulting from transients in adjacent leads, which algebraically contribute to the total voltage drop across the lead and bondwire. These components are equal to the product of the mutual inductance between the lead and an adjacent lead, and the di/dt of the adjacent lead.

Where lead 30 is a power lead, for example ground lead 12l or $V_{cc}$ lead 12x of the PDIP leadframe of FIG. 1, a large di/dt is likely to occur in a high performance device. The voltage at the die is the algebraic sum of the voltage at the outside end of the lead and v(t).

Certain integrated circuits are known to be affected by voltage perturbations on the power rails of the chip, due to voltage transients across the package leads. In the buffered ECL switch, for example, emitter followers are included to render the output voltage levels of the basic ECL switch compatible with the input of the following switch, to isolate the collector nodes from load capacitance, and to provide current gain. The collectors of the transistors in the emitter followers are returned to a separate $V_{cc}$ lead, to insure that any changes in load currents during switching do not cause a change in $V_{cc}$ of the basic ECL switch through the small but finite inductance of the emitter follower bondwire and package lead. Outside the package, the two $V_{cc}$ leads are connected to the common $V_{cc}$ distribution, requiring an additional pin. See, e.g., Fairchild Camera and Instrument Corporation, ECL Data Book, 1977, pp. 2-3, 2-4.

SUMMARY OF THE INVENTION

An object of the present invention is to reduce the effect of power rail perturbations on the performance of integrated circuits.

Another object of the present invention is to provide a lead configuration for integrated circuits that is useful in reducing the effect of power rail perturbations on the performance of integrated circuits.

A further object of the present invention is to provide a leadframe for standard PDIP packages having an increased lead count.

In one embodiment of the present invention, these and other objects are achieved in the context of an integrated circuit comprising at least two device stages. The device stages are provided with respective isolated power rails of a given type, for example $V_{cc}$ or ground or both. A first lead is coupled to one on-chip power rail of a given type, and a second lead is coupled to another on-chip power rail of the same type. The respective other ends of the first and second leads are coupled to one another, for coupling thereby the first and second leads to a suitable external power line. For example, the lead ends may be merely merged and formed into a pin. Preferably, the inductance of the means used for coupling the other ends of the first and second leads is minimized.

In another embodiment, one of the device stages is an output buffer having an input circuit, an output circuit with an output pulldown transistor, and a DC Miller killer circuit. The DC Miller killer is improved to avoid aggravating ground bounce. The improvements include delaying the turn-on of the DC Miller killer circuit, and limiting the discharge rate of the output pulldown transistor through the DC Miller killer circuit.

In yet another embodiment, the paddle of a PDIP leadframe is supported by tiebars that extend to the dambars at the sides of the leadframe. An additional lead is obtained from a conductive element originating near the paddle and supported by one of the two leadframe rails.

In a further embodiment, an octal registered transceiver is provided with isolated $V_{cc}$ and ground rails for the latch and output buffers. The lead configuration described above is used for both $V_{cc}$ and ground. Several circuits are improved to optimize performance of the device.

BRIEF DESCRIPTION OF THE DRAWINGS

In the drawings, where like reference characters indicate like parts.

DETAILED DESCRIPTION OF THE PREFERRED EMBODIMENT

Figure 6:
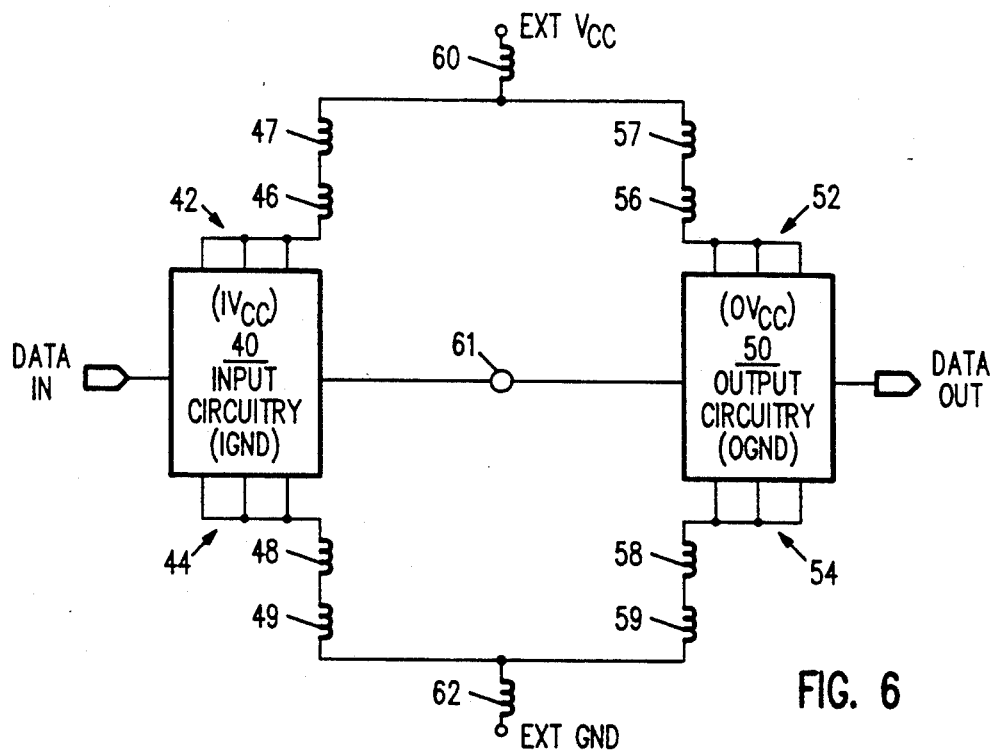
FIG. 6 is a schematic illustration of a lead configuration use with isolated input circuitry and output circuitry, in accordance with the present invention.
Figure 7:
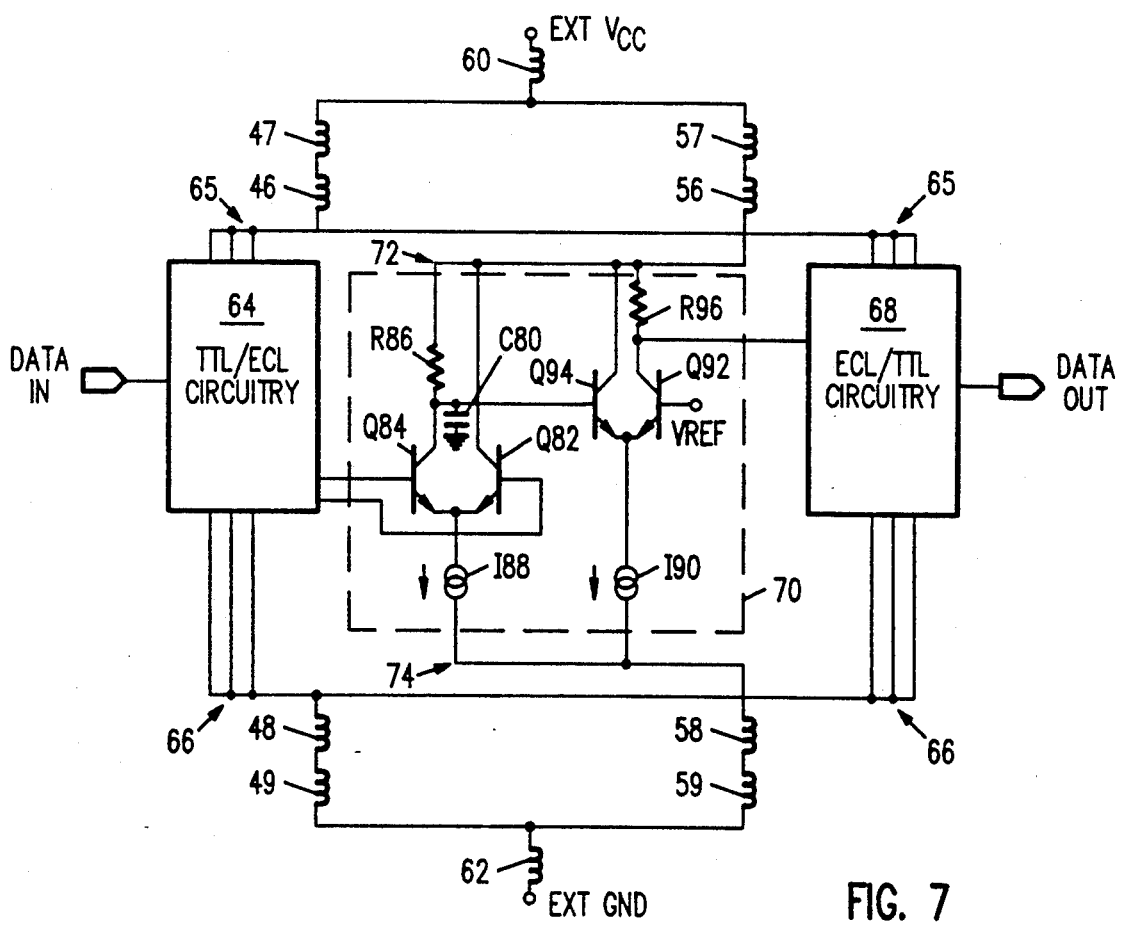
FIG. 7 is a schematic illustration of a lead configuration use with isolated TTL/ECL circuitry and ECL circuitry, in accordance with the present invention.

The effect of power rail perturbations is significantly reduced in an integrated circuit having isolated internal rails of the same type (for example, $V_{cc}$ or ground or both) connected to a pin through respective leads, as illustrated in FIGS. 6 and 7.

In FIG. 6, for example, the internal power rails for the input circuitry 40 are isolated from the internal power rails for the output circuitry 50. Input circuitry 40 includes internal rail 42 for $V_{cc}$ (IV$_{cc}$), and internal rail 44 for ground (IGND). Output circuitry 50 includes internal rail 52 for $V_{cc}$ (OV$_{cc}$), and internal rail 54 for ground (OGND). The isolated internal $V_{cc}$ rails 42 and 52 are coupled to external $V_{cc}$ through respective leads merging and then terminating in a single pin, and are connected to the leads in any suitable manner, such as, for example, by bondwire. The isolated internal ground rails 44 and 54 are connected to external ground through respective leads merging and then terminating in a single pin, and are connected to the leads in any suitable manner, such as, for example, by bondwire.

The $V_{cc}$ path from internal rail 42 includes bondwire inductance 46, lead inductance 47, and common inductance 60 of merged leads. Similarly, the $V_{cc}$ path from internal rail 52 includes bondwire inductance 56, lead inductance 57, and the common inductance 60. The value of common inductance 60 preferably is minimized. Similarly, the ground path from internal rail 44 includes bondwire inductance 48, lead inductance 49, and common inductance 62 of merged leads. The ground path from internal rail 54 includes bondwire inductance 58, lead inductance 59, and the common inductance 62. The value of common inductance 62 preferably is minimized.

Coupling isolated internal $V_{cc}$ rails and isolated internal ground rails to $V_{cc}$ and ground as described above provides great improvement in performance. A significant reduction in the effect of power rail perturbations on IC performance is achieved by providing isolated rails for either $V_{cc}$ or ground, and coupling the isolated rails to $V_{cc}$ or ground (as appropriate) through use of the lead configuration described above. For example, isolated ground rails coupled to ground through respective leads provides relief from ground bounce.

A dynamic ground reference changer may be but need not be provided between the input circuitry 40 and output circuitry 50 at node 61. A particular embodiment of circuitry 61 is described below, in the context of the latch and output buffer illustrating circuits 40 and 50.

The embodiment of FIG. 7 pertains to the combination of small single sided swing ECL internal circuitry with TTL input/output. Without isolated power rails, ECL circuitry 70 suffers a functional failure when either a high going ground bounce or a low going $V_{cc}$ squeeze causes substrate capacitance C80 to discharge through transistor Q84 into constant current source I88. The current from capacitor C80 displaces current from resistor R86, allowing the collector of transistor Q84 to rise. When under certain circumstances the potential on the collector of transistor Q84 rises above VREF supplied to transistor Q92, transistor Q94 turns ON and provides a spurious HIGH at the output of the ECL circuitry 70. Moreover, without isolated power rails, ECL circuitry 70 suffers degraded dynamic performance as processing of present data "squeezes" voltage on internal power rails.

As illustrated in FIG. 7, the internal $V_{cc}$ rail 72 and internal ground rail 74 of the ECL circuitry 70 are isolated from the internal $V_{cc}$ rail 65 and internal ground rail 66 of TTL circuitry 64 and 68. $V_{cc}$ rails 65 and 72 are connected to external $V_{cc}$ substantially as described above in the context of FIG. 6. Similarly, ground rails 66 and 74 are connected to external ground substantially as described above in the context of FIG. 6. Accordingly, the effect of power rail perturbations in the TTL circuitry 64 and 68 on the ECL circuitry 70 is significantly reduced.

Figure 2:
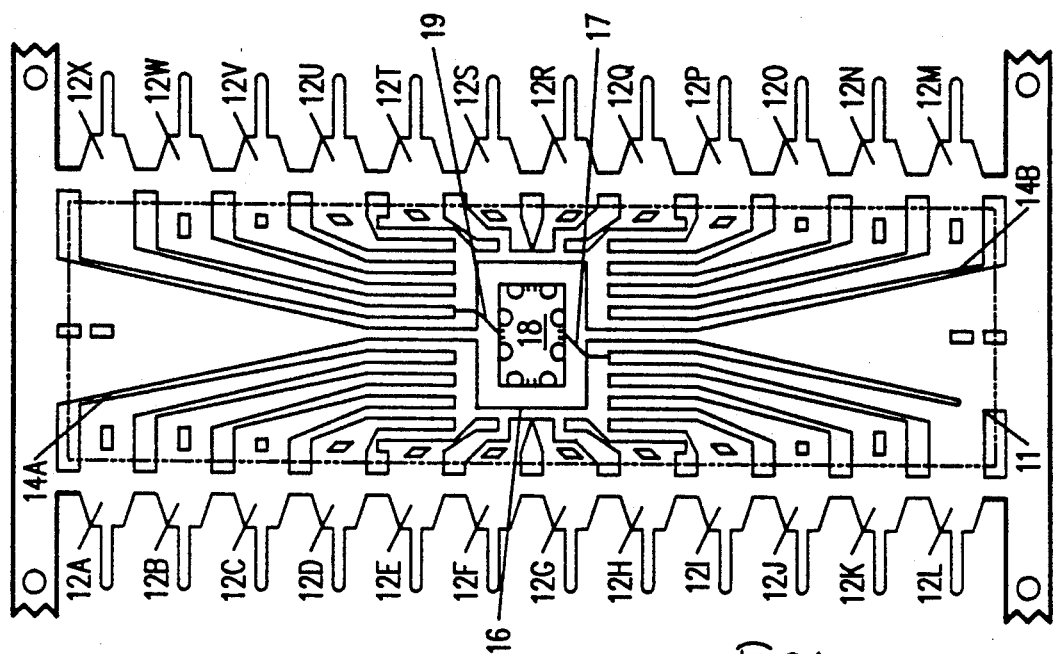
FIGS. 1-4 are plan views illustrating prior art lead frames.
Figure 1:
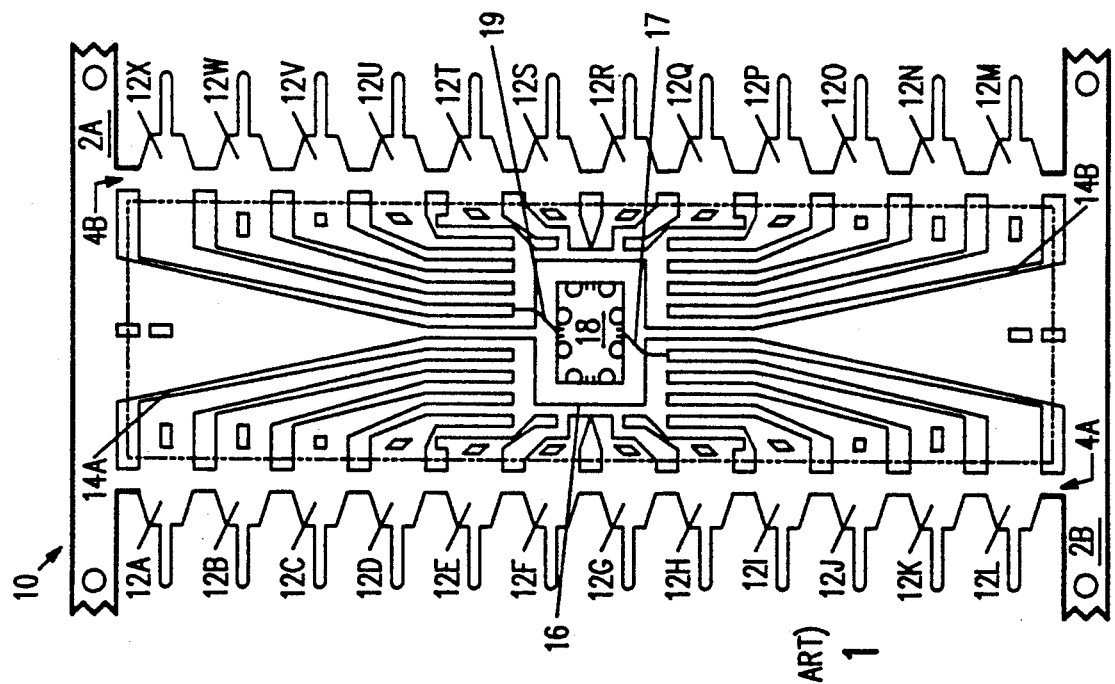
Figure 8:
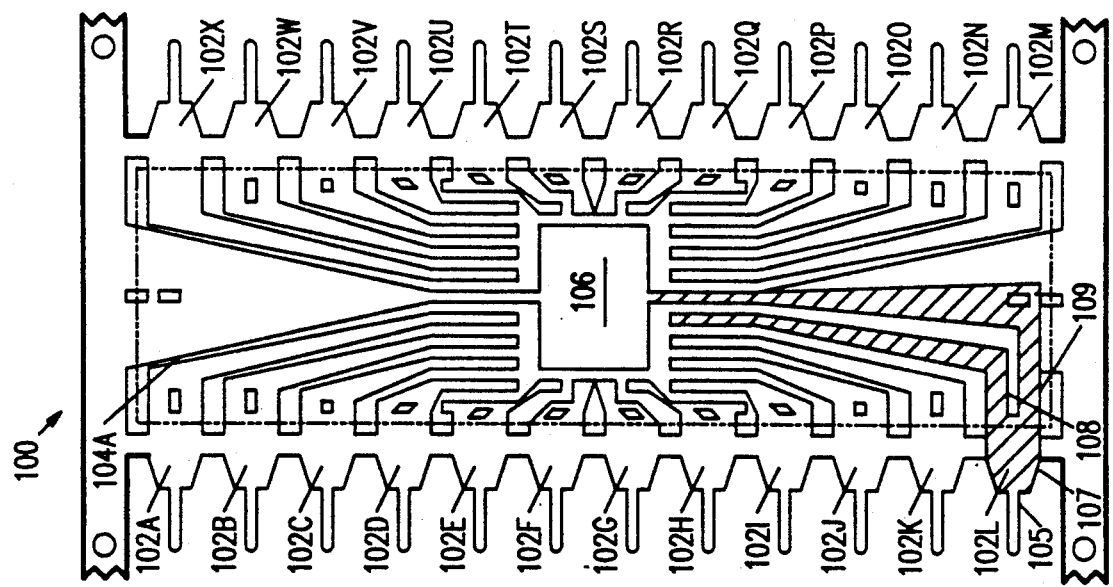

A leadframe 100 for use in PDIP integrated circuits having only ground rail isolation is illustrated in FIG. 8. Leadframe 100 is based on leadframe 10 of FIG. 1. Note that the leadframe 100 conforms to conventional pin assignments, in that external ground and external $V_{cc}$ are supplied from corner locations through leads 102/ and 102x respectively. Lead 102l includes three distinct segments: a long segment 108 (crosshatched right to left for clarity), which corresponds in part to ground lead 12l of leadframe 10; a long segment 109 (crosshatched left to right for clarity), which corresponds in part to tie bar 104b of leadframe 10; and a short segment 1107, where segments 108 and 109 merge to form pin 105. The inductance of segment 108 plus bondwire (corresponding, for example, to inductances 49 and 48 respectively) is about 11.7 nH. The inductance of segment 109 plus bondwire (corresponding, for example, to inductances 59 and 58 respectively) also is about 11.7 nH. By contrast, the inductance of segment 107 (corresponding, for example, to inductance 62) is about 0.9 nH.

Figure 9:
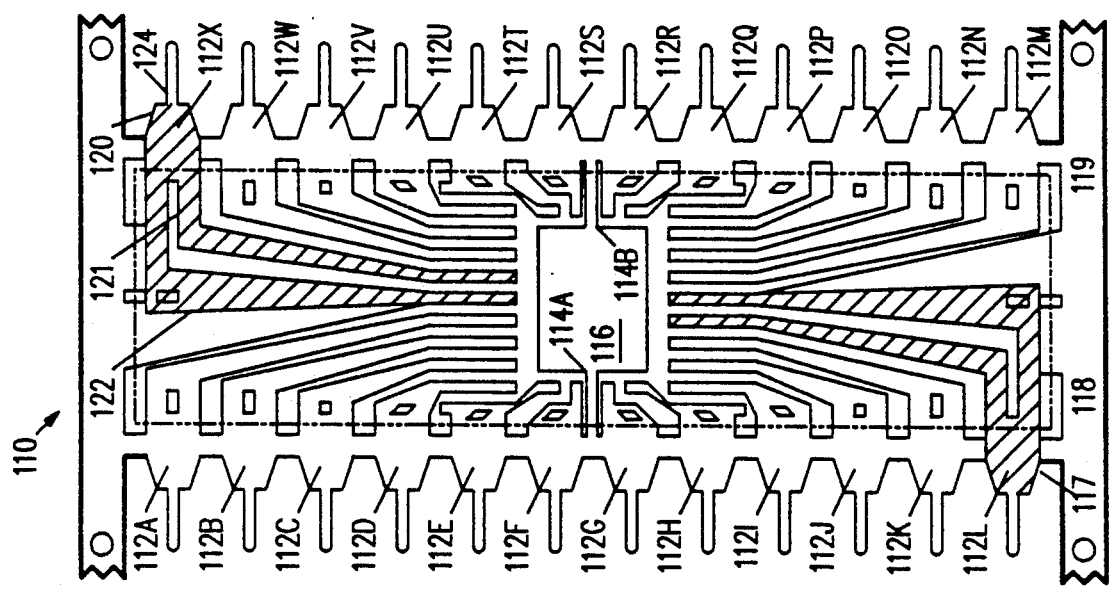

A leadframe 110 for use in PDIP integrated circuits having full power rail isolation is illustrated in FIG. 9. Leadframe 110 also is based on leadframe 10 of FIG. 1. Paddle 116 is supported by short tiebars 114a and 114b, which extend only a short distance to respective dambars at the pin sides of the leadframe 110 rather than toward the leadframe rails. Tiebars 114 of leadframe 110 provide the function of mechanically supporting the paddle 116, a function provided in leadframe 10 by tiebars 14. Similar to lead 102l of leadframe 100 (FIG. 8), ground lead 112l includes three distinct segments: long segment 118, long segment 119, and short segment 117. Long segment 119 corresponds in part to tiebar 14b of leadframe 10, but is isolated from paddle 116 and no longer functions as a tiebar. $V_{cc}$ lead 112x includes three distinct segments as well: a long segment 121 (crosshatched right to left for clarity), which corresponds in part to $V_{cc}$ lead 12x of leadframe 10; a long segment 122 (crosshatched left to right for clarity), which corresponds in part to tiebar 14a of leadframe 10 but is isolated from paddle 116 and no longer functions as a tiebar; and a short segment 120, where segments 121 and 122 merge to form pin 124. The inductance of segment 121 with bondwire (corresponding, for example, to inductances 47 and 46 respectively) and of segment 122 with bondwire (corresponding, for example, to inductances 57 and 56 respectively) is about 11.7 nH. The inductance of segment 120 (inductance 60) is about 0.9 nH.

Figure 4:
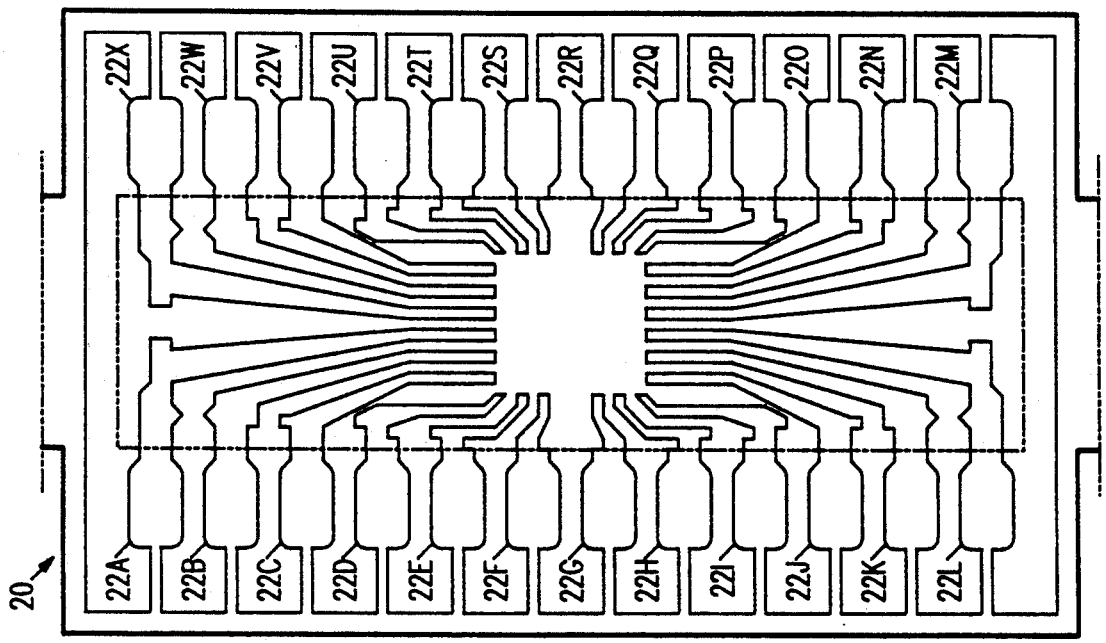
Figure 3:
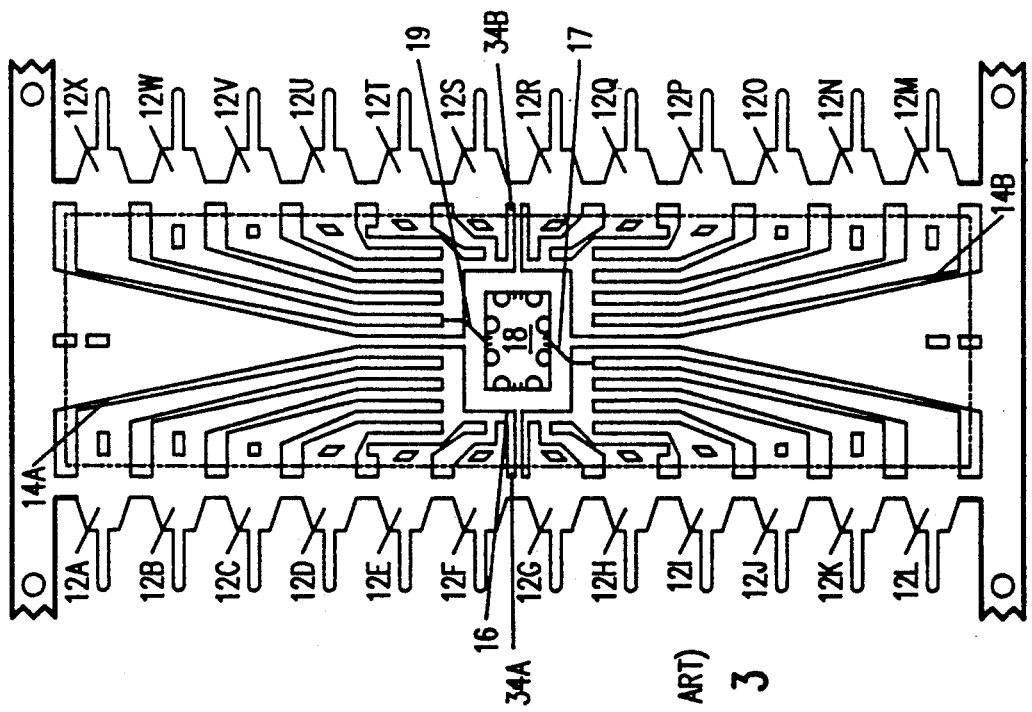
Figure 10:
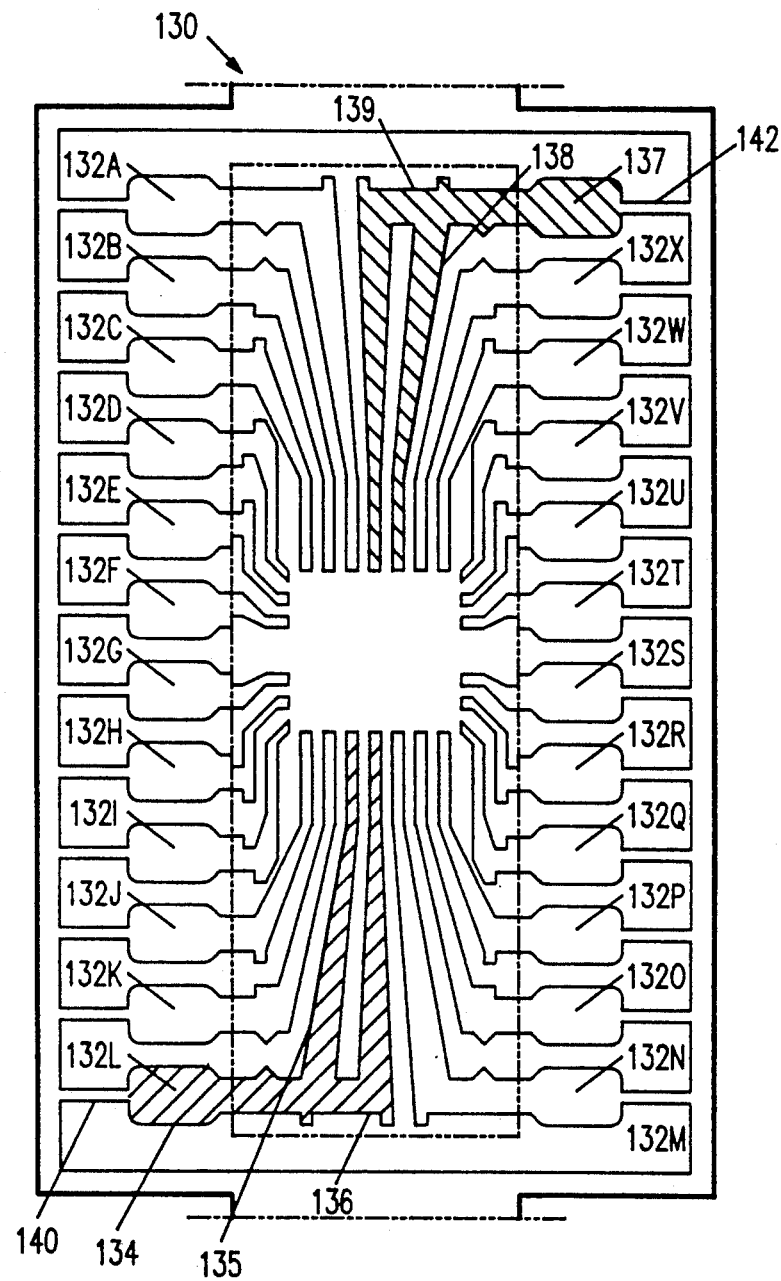
FIGS. 8-10 are plan views illustrating exemplary lead frames in accordance with the present invention.
Figure 5:
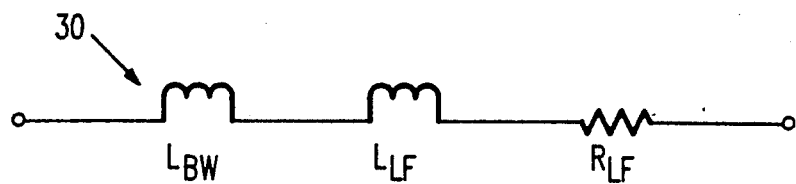
FIG. 5 is a schematic illustration of the inductances and resistance associated with the current path from an integrated circuit power rail to a pin.

A leadframe 130 for use in power rail isolated CDIP ICs is illustrated in FIG. 10. Leadframe 130 is based on leadframe 20 of FIG. 4. Ground lead 132l includes three distinct segments: long segments 135 and 136, and a short segment 134 where segments 135 and 136 merge to form pin 140. $V_{cc}$ lead 132x also includes three distinct segments: long and 136 merge to form pin 142. The characteristics of leads 132l and 132x are similar to those of leads 112l and 112x of leadframe 110 of FIG. 9.

In an illustrative preferred embodiment, the leadframe of either FIG. 9 or 10 is used with an improved octal registered transceiver, the logic operations of which are described below with reference to FIG. 11. It will be appreciated that the preferred embodiment of our invention is exemplary only, and that our invention may be applied to reduce the effect of power rail perturbations in many other types of integrated circuit devices.

Figure 11:
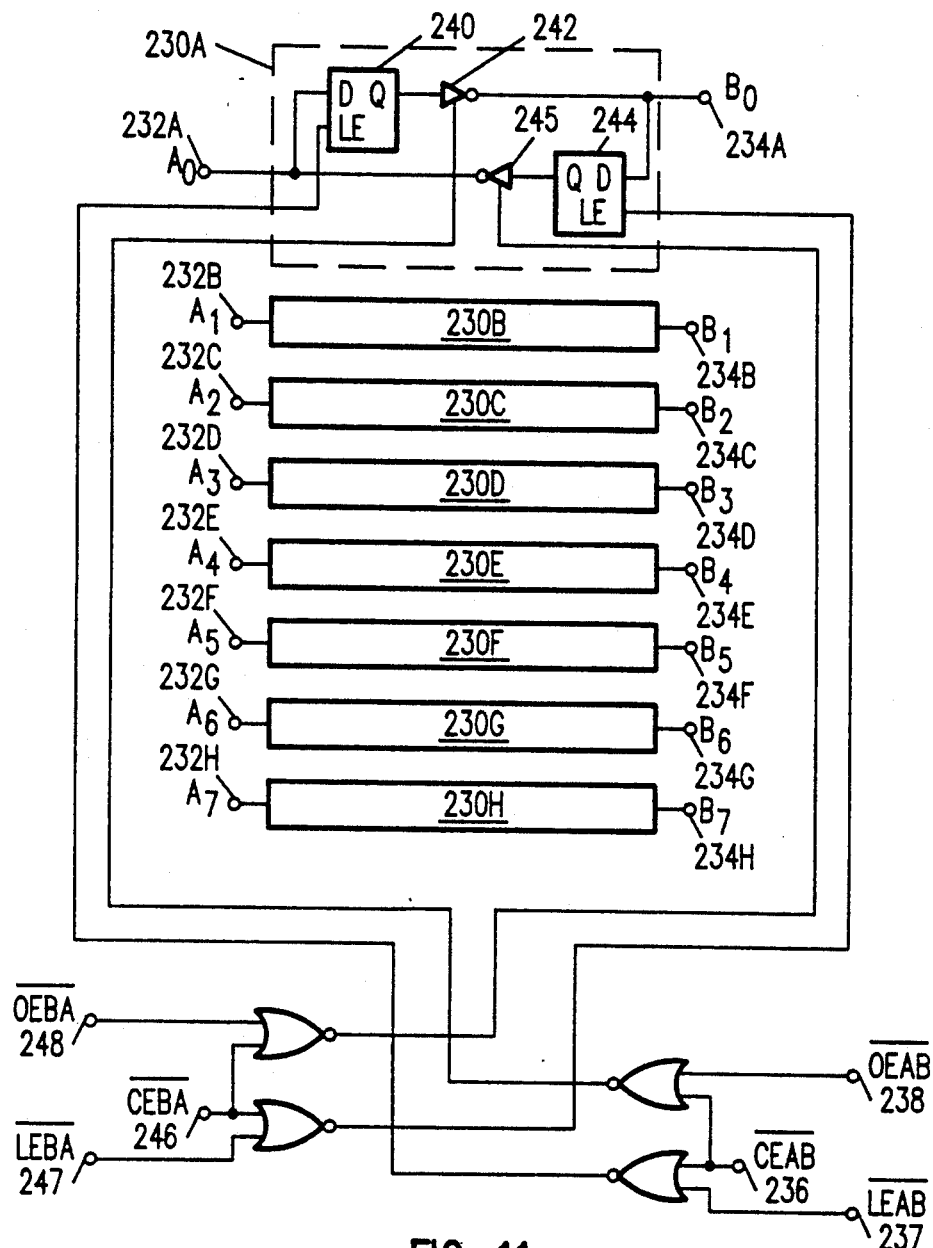
FIGS. 11, 12a and 12b are schematic illustrations of an octal registered transceiver, in accordance with the present invention.

The octal transceiver of FIG. 11 includes two sets of D-type latches with separate input and output controls for each set, for temporary storage of data flowing in either direction. Latch enable (LE) and output enable (OE) inputs are provided for each register to permit independent control of inputting and outputting in either direction of data flow. For data flow from A to B, for example, the A-to-B enable ($\overline{CEAB}$) input terminal 236 must be LOW to enter data $A_0$-$A_7$ through terminals 232a-232h and/or to take data $B_0$-$B_7$ from terminals 234a-234h. With $\overline{CEAB}$ LOW, a LOW signal on the A-to-B latch enable ($\overline{LEAB}$) input terminal 237 renders the A-to-B latches (for example, latch 240 of transceiver 230a) transparent. A subsequent LOW-to-HIGH transition of $\overline{LEAB}$ puts the A-to-B latches in storage mode, which makes them insensitive to transitions of $A_0$-$A_7$. With e,ovs/CEAB/ LOW, a LOW signal on the A-to-B output enable ($\overline{OEAB}$) input terminal 238 renders the tristate A-to-B output buffers (for example, buffer 242 of transceiver 230a) active, whereby they respectively reflect the data present at the outputs of the A-to-B latches. A subsequent LOW-to-HIGH transition of $\overline{OEAB}$ forces the output buffers into their high impedance state. Control of data flow from B to A is similar, but is driven by signals $\overline{CEBA}$ (B-to-A enable), $\overline{LEBA}$ (B-TO-A latch enable) $\overline{OBEA}$ (B-to-A output enable) applied to terminals 246, 247 and 248 respectively. Transceiver 230a also includes D-latch 244 and buffer 245, which are equivalent in function to latch 240 and buffer 242 for data flow from B-to-A.

Without isolated power rails, the device of FIG. 11 was found to provide a spurious data bit during multiple low to trusted (LZ) transitions with heavily loaded outputs. In one instance, an output buffer was coupled to a resistive loading of about 75 ohms to $V_{cc}$ and a capacitive loading of about 500 pF to ground. Seven of the high current outputs were taken from LOW (corresponding to HIGH at the inputs) to trusted, while the eighth was taken from HIGH (corresponding to a LOW at the input) to tristate. In attempting to latch data during or immediately after the tristate transition, the device of FIG. 11 latched a HIGH level instead of a LOW level into the eighth bit. It will be appreciated that the device of FIG. 11 is asynchronous, and the arrival time of the latch enable signal is not controllable.

Figure 12A:
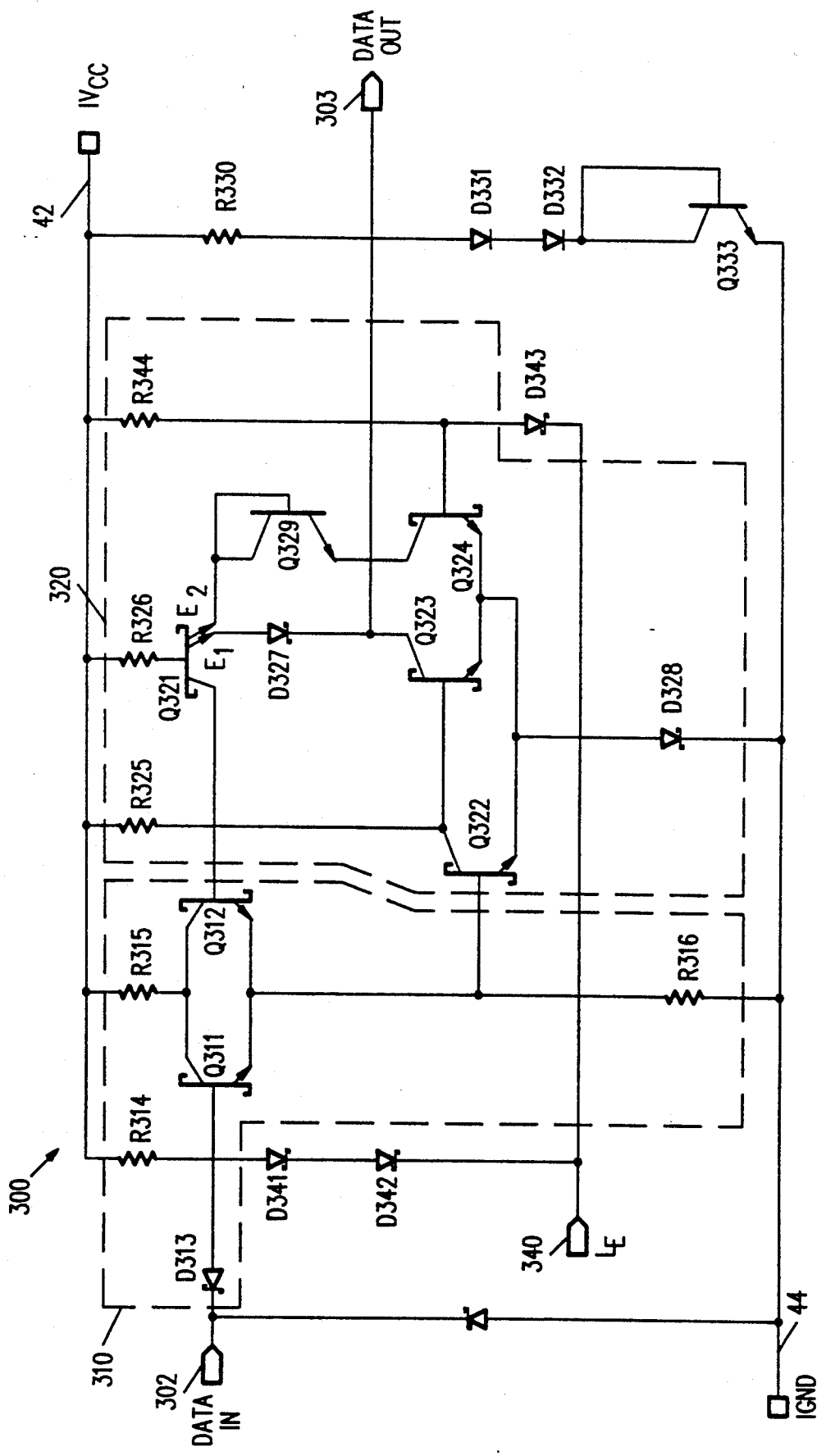
Figure 12B:
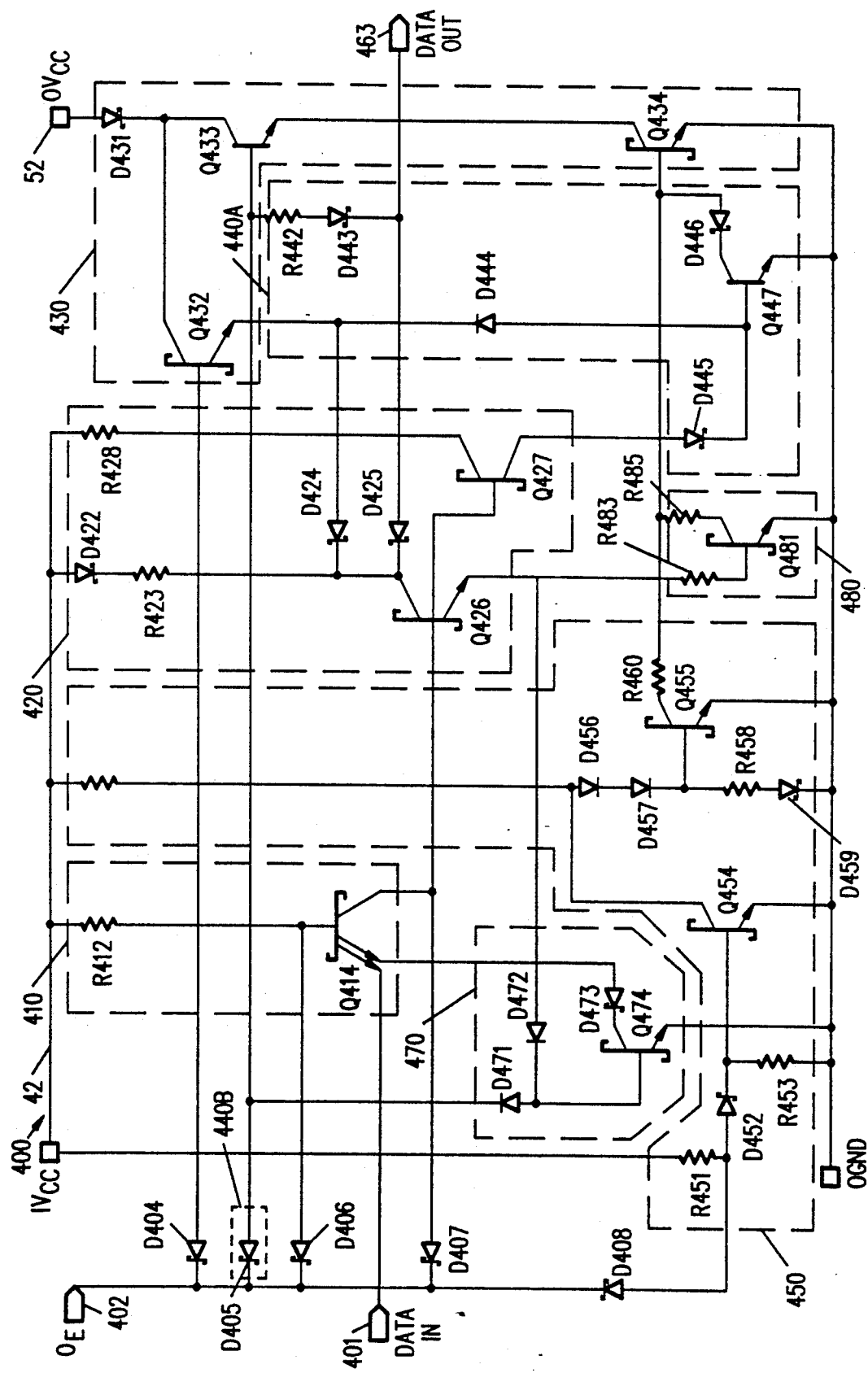

A schematic diagram of a latch 300 and an output buffer 400, modified to reduce the effect of power rail perturbations, is set forth in FIGS. 12A and 12B respectively. Power is provided to latch 300 and some circuits in buffer 400 through isolated power rails 42 ($IV_{cc}$) and 44 (IGND). Power is provided to other circuits in buffer 400 through isolated power rails 52 ($OV_{cc}$) and 54 (OGND).

Latch 300 is transparent to data applied to terminal 302 (DATA IN) when latch enable input signal $L_e$ is in a HIGH state. Latch enable signal $L_e$ is applied at terminal 340, which is connected to the base of Schottky transistor Q311 in switch 310 through Schottky diodes D341 and D342, and to the base of Schottky transistor Q324 in switch 30 through Schottky diode D343. Transistor Q324 is ON due to base drive through resistor 344, forward biasing the $BE_2$ junction of Schottky transistor Q321 in switch 320 through the BC (shorted collector) diode D329. The potential at the base of transistor Q321 goes to about $2V_{be} + V_{ce}30\ V_{sd}$ above ground, which is not sufficient to turn transistor Q312 ON. Hence, so long as $L_e$ is HIGH, Q312 is unaffected by the level at DATA IN and remains OFF.

When DATA IN goes low, Schottky diode D313 conducts and pulls down the base of Schottky transistor Q311 in switch 310, turning it OFF. Schottky transistor Q312 is OFF. Schottky transistor Q322 in switch 320 turns OFF and allows Schottky transistor Q323 in switch 320 to turn ON through resistor R325 and Schottky diode D328. As a result, (a) the output terminal 303 is brought LOW; and (b) the BE₁ junction of multiple emitter Schottky transistor Q321 is forward biased through resistor R326 and Schottky diode D327, whereby the potential at the base of transistor Q321 becomes $V_{be}+V_{ce}+2V_{sd}$ above ground. Transistor Q312 remains OFF.

When DATA IN goes HIGH, transistor Q311 in switch 310 conducts and turns transistor Q322 in switch 320 ON. As a result, transistor Q323 in switch 320 turns OFF, whereby output terminal 303 is brought up to $3V_d$ through resistor R330, pn diodes D331 and D332, and BC (shorted collector) diode D333.

Data is latched by applying a LOW to $L_e$ terminal 340. The base of transistor Q311 is limited to $2V_{sd}+V_{ce}$ by Schottky diodes 341 and 342 and the $V_{ce}$ of the latch enable buffer (not shown) to ensure that transistor Q311 is held OFF. At the same time, the base of transistor Q324 in switch 320 is brought LOW through diode D343, and transistor Q324 turns OFF. As a result the state of transistor Q323 prior to the HL transition of $L_e$ controls the state of transistor Q312 in switch 310, which in turn maintains the state of transistor Q323. Assuming Q323 ON (logical LOW at DATA OUT), the potential at the base of Q321 is $V_{be}+2V_{sd}+V_{ce}$, which is not sufficient to turn ON transistors Q312 and Q322. Transistor Q323 remains ON. Assuming Q323 OFF (logical HIGH at DATA OUT), the potential at the base of Q321 rises from $V_{be}2V_{sd}V_{ce}$ to $2V_{be}+2V_{sd}$ as $L_e$ goes LOW, which is sufficient to keep transistors Q312 and Q322 ON. Transistor Q323 remains OFF.

As will be appreciated, latch 300 is sensitive to power rail perturbations. Erroneous operation of the latch 300 absent the power rail isolation feature occurs, for example, when the latch 300 attempts to latch a LOW while the transceiver is recovering from negative ground bounce exceeding $2V_{be}+V_{sd}(D328)-V_{sd}(D313)$ (less than about 1.5V). In this event, transistors Q311 and Q322 turn ON, and switch 320 latches a HIGH. Isolating the internal $V_{cc}$ rail 42 and ground rail 44 from the internal output power rails 52 and 54 (FIG. 12B) does not allow output ground bounce of sufficient magnitude to couple into internal IGND rail 44, thereby avoiding erroneous operation due to power rail perturbations.

An improved Schottky clamped TTL output buffer 400 derived from a standard circuit is shown in FIG. 12B. The circuit stages in the buffer 400 preferably include the input stage 410, a phase splitter stage 420, an output stage 430, a squaring network 480, an AC Miller killer circuit 440 (including sections 440a and 440b), and a DC Miller killer 450. A dynamic ground reference changer 470 may be provided to further reduce the effect of ground bounce; otherwise, the second emitter of transistor Q414 is omitted. Rail 42 is the isolated internal rail $IV_{cc}$ (see FIG. 12A), rail 52 is the internal output $OV_{cc}$ rail, and rail 54 is the internal output ground OGND rail.

With $O_e$ HIGH at terminal 402, the operation of the output buffer 400 is as follows The input stage 410 includes multiple emitter Schottky transistor Q414, the first emitter of which is connected to DATA IN through terminal 401. When DATA IN is LOW, transistor Q414 is forward biased through resistor R412 and pulls its collector LOW. The LOW is applied to the common bases of Schottky transistors Q426 and Q427 in phase splitter 420. Transistors Q426 and Q427 do not cut in; as a result, the Darlington pair of Schottky transistor Q432 and transistor Q433 in the output stage 430 conducts through Schottky diode D431 and raises output terminal 403 HIGH. Note that the buffer 400 is inverting. Pulldown transistor Q434 is OFF at this time.

When DATA IN goes high, transistor Q414 turns OFF and its BC junction becomes forward biased, which in turn forward biases transistors Q426 and Q427. Transistor Q427 pulls down the base of transistor Q432 in the Darlington pair, turning it and transistor Q433 OFF. About the same time, Transistor Q434 also becomes forward biased, its base flow obtained through resistor R428 and transistor Q427, resistor R423 and transistor Q426, and resistor R412 and the Schottky clamp of transistor Q414. Transistor Q434 pulls down output terminal 403, providing a LOW.

Diodes D424 and D425 are speed up diodes to discharge capacitances. When transistor Q426 turns ON and its collector voltage falls, diode D424 provides a discharge path for internal capacitance at the base of transistor Q433. Diode D425 provides a discharge path for load capacitance at terminal 403 through transistor Q426 to increase the base current of transistor Q434 and improve its current sinking capability during the HIGH-to-LOW output voltage transition.

Squaring network 480 includes Schottky transistor Q481 and resistors R483 and R485, connected between the base of transistor Q434 and internal output ground rail 54.

The output buffer 400 is tristated by application of a LOW to $O_e$ terminal 402. In this event, the base of transistor Q414 in the input stage 410 is pulled down through Schottky diode 406, the common base of transistors Q426 and Q427 in the phase splitter 420 is pulled down through Schottky diode D407, and the base of transistor Q432 in the output stage 430 is pulled down through Schottky diode D404. A high impedance is thus presented at the output terminal 403.

The dynamic ground reference changer 470 functions to improve the noise margin at the interface of the latch 300 and buffer 400, which otherwise would be degraded by isolation of the respective internal power rails 42 and 44 from internal output power rails 52 and 54.

In the absence of circuit 470, the LH transition on output terminal 403 will experience noise in the form of a flat spot, glitch, or oscillation, as follows. Assuming that transistor Q434 in the output stage 430 is loaded with current from a following device (not shown), a HL transition at the latch input terminal 302 will cause transistor Q323 in latch switch 320 to conduct. After some propagation delay time, transistor Q434 will turn OFF, causing a large negative di/dt along the output ground rail 54. Note that transistors Q426 and Q427 in the phase splitter 420 and transistor Q434 in the output stage 430 are held OFF by the path through Q414 in input stage 410, and Q323 and diode D328 in switch 320. When $$V_{sd}(Q323)+V_{sd}(D328)+V_{sd}(Q414) > V_{be}(Q426)+V_{be}(Q434)+V_{groundbounce} \quad (2)$$

then the LH transition on the collector of transistor Q434 will have a flat spot, glitch, or oscillation.

The dynamic ground reference changer 470 functions to reference a second emitter of Q414 to output internal ground rail 54 instead of the isolated internal ground rail 44 during ground bounce During an output LH transition at terminal 403, the cathode of diode D471 (shown enhanced), which is connected to the emitter of transistor Q432 in the output stage 430, begins to rise.

Diode D471 is reversed biased, and couples sufficient current through its junction capacitance to the base of Schottky transistor Q474 (shown enhanced) to saturate it Once saturated, transistor Q474 holds LOW the second emitter of transistor Q414, whereby the common base of transistors Q426 and Q427 in phase splitter 420 are referenced to output ground. During an output LH transition on other terminals of the octal registered transceiver when terminal 403 is high, the potential at the cathode of diode D471 falls slightly due to the di/dt of the charging current flowing in the $V_{cc}$ power rails. Nonetheless, an occurrence of ground bounce will cause the anode of diode D471 to fall faster the falling potential at its cathode. Diode D471 is reversed biased, and again couples sufficient current to the base of transistor Q474 to saturate it. A suitable value for the junction capacitance of diode D471 is about 300 fF, bearing in mind that the actual value depends on the values selected by the designer for the other circuit components. Other elements in circuit 470 include diodes D472 and D473. Diode D472 is connected between the base of transistor Q474 and the base of pulldown transistor Q434 to avoid completely discharging the base of transistor Q474 when a falling transition is present at the N-side of diode D471. Diode D473 is connected between the collector of transistor Q474 and the second emitter of transistor Q414, for providing the same LOW level as provided by the latch 300.

The AC Miller killer circuit 440 functions to improve the output rise time and minimize power consumption during repetitive switching. In principle, the AC Miller killer circuit 440 provides a momentary low impedance at the base of transistor Q434 during an output LH transition, thereby absorbing displacement current flowing through the collector-base capacitance of transistor Q434. In operation, rising voltage at the emitter of transistor Q432 causes displacement current to flow through BC diode D444, momentarily turning on transistor Q447. Transistor Q447 pulls down the base of transistor Q434 of the output stage 430 to absorb the displacement current flowing through the CB capacitance of Q434. When Q434 turns ON, diode D444 is discharged by D424. Diode D446 optimizes the pulldown level of transistor 447.

Unfortunately, a standard AC Miller killer circuit aggravates power rail perturbation during an LZ transition at high speed and with heavy loads at the output. In a standard AC Miller killer circuit arrangement, the cathode of D444 would reference to the output (terminal 403) through only a resistor (not shown). While the output is relatively stable during an LZ transition, a power rail perturbation such as, for example, ground bounce, causes internal ground to fall, thereby increasing the voltage across diode D444. Diode D444 discharges into transistor Q447, turning it ON and draining off some base charge from Q434. As a result, the discharge rate of Q434 is hastened, aggravating the ground bounce.

This problem is solved in AC Miller killer circuit 440 by removing the discharge effect. Schottky diode D405 (shown enhanced) functions to prevent circuit 440 from responding during an LZ transition by pulling the cathode of diode D444 to a level $V_{sd}$ above $O_e$, thereby preventing the development of a positive dv/dt across diode D444 during ground bounce. Schottky diode D443 (shown enhanced) is added to the circuit referencing D444 to the output 403, so that $O_e$ terminal 402 will not sink current through resistor 442 and diode D405 when output terminal 403 is tristated and the bus is brought HIGH.

Figure 13:
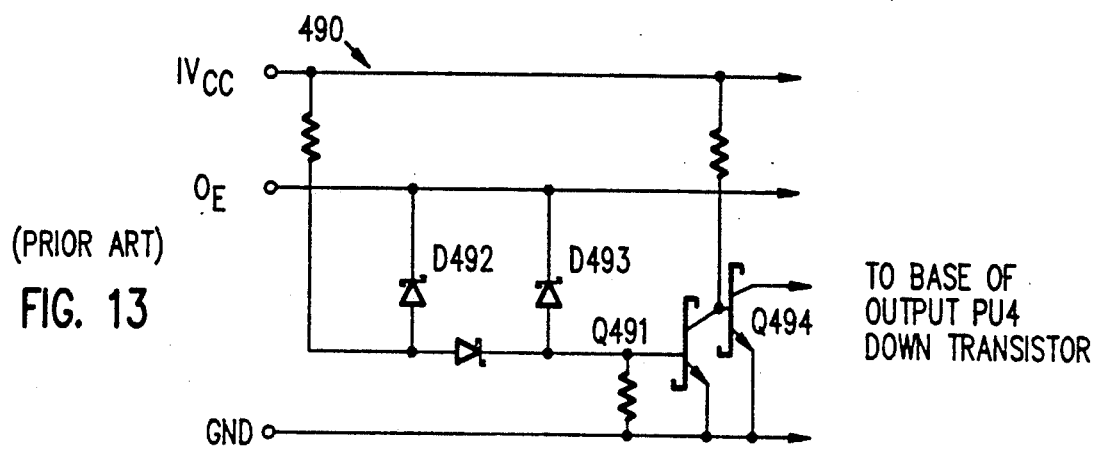
FIG. 13 is a schematic illustration of a standard DC Miller killer circuit.

The DC Miller killer 450 provides the output stage 430 with immunity from noise on the bus when output buffer 400 is in tristate. A large positive voltage spike on the bus could couple charge across the Miller capacitance of transistor Q434 and erroneously turn it ON. In a standard DC Miller killer circuit (FIG. 13), Schottky transistor Q491 is held OFF by a LOW Oe through Schottky diode D492. Schottky transistor Q494 is ON, holding down the base of the output pulldown transistor and providing a low impedance path to ground for any charged coupled through its BC (Miller) capacitance.

Unfortunately, a standard DC Miller killer circuit also aggravates power rail perturbation during an LZ transition at high speed and with heavy loads at the output. As $O_e$ is brought LOW, Q494 rapidly turns ON and rapidly discharges the base of the output pulldown transistor, thereby aggravating ground bounce.

This problem is solved in DC Miller killer circuit 450 by delaying its turn on and by limiting the discharge rate of the output pulldown transistor through circuit 450. The turn on of circuit 450 is delayed by the addition of pn diodes D456 and D457 (shown enhanced) between the collector of transistor Q454 and the base of transistor Q455, which increase the voltage swing required to turn on transistor Q455 and lowers the amount of base drive available to it. As diodes D456 and D457 block discharge of stored charge in the base of Q455, an alternate discharge path is provided from the base of Q455 to ground through resistor R458 and diode D459 (shown enhanced). The discharge rate of the output pulldown transistor Q434 through circuit 450 is limited by the addition of resistor R460 (shown enhanced), having a low value of for example 500 ohms, in the collector circuit of transistor Q455. The value of resistor R460 should be limited to avoid negating the purpose of the DC Miller killer circuit 450.

While the invention has been described with reference to particular embodiments, the invention is not intended to be limited to the particular embodiments. For example, although $V_{cc}$ and ground are supplied from corner pins in some of the preferred embodiments, our invention is also applicable to integrated circuits wherein $V_{cc}$ and ground are provided through other pins, including centered pins. Variations within the spirit and scope of the invention will occur to those skilled in the art.

What is claimed is:

1. An octal registered integrated circuit transceiver having reducing ground bounce effect, comprising:
   a latch having $IV_{cc}$ and IGND power rails;
   an output buffer comprising
     an input circuit coupled to the output of said latch and having said $IV_{cc}$ rail in common with said latch;
     a phase splitter circuit coupled to said input circuit and having said $IV_{cc}$ in common with said latch;
     an output circuit coupled to said phase splitter circuit and having an isolated $OV_{cc}$ rail and an isolated OGND rail;
     an AC Miller killer circuit coupled to said output circuit; and
     A DC Miller killer circuit coupled to said output circuit;
   a ground lead configuration comprising a first lead having one end connected to said IGND rail; and a second lead having one end connected to said OGND rail, said first and second leads being merged at the respective other ends thereof for coupling said first and second leads to external ground; and A $V_{cc}$ lead configuration comprising a third lead having one end connected to said $IV_{cc}$ rail; and a fourth lead having one end connected to said $OV_{cc}$ rail, said third and fourth leads being merged at the respective other ends thereof for coupling said third and fourth leads to external $V_{cc}$.

2. An octal registered transceiver as in claim 1, further comprising a dynamic ground reference circuit coupled to said latch and said output buffer for improving the noise margin at the interface of said latch and output buffer.

3. An integrated circuit output buffer having an input circuit, and output circuit having an output pulldown transistor, and a DC miller killer circuit, said DC Miller killer circuit comprising:

a first transistor for discharging charge coupled through the Miller capacitance of said output pulldown transistor;

a first resistor connected between the collector of said first transistor and the base of said output pulldown transistor, the value of said first resistor being selected to limit the discharge rate of said output pulldown transistor;

a second transistor for switching said first transistor in response to an output enable signal;

at least one diode connected between the collector of said second transistor and the base of said first transistor, the number of diodes being selected to delay the turn-on of said first transistor; and an alternate discharge path including a resistor and a diode connected in series between the base of said first transistor and ground, for discharging stored charged from the base of said first transistor.

4. An output buffer as in claim 3, wherein a $V_{cc}$ power rail coupled to said input circuit and said DC Miller killer circuit is isolated from a $V_{cc}$ power rail coupled to said output circuit.

* * * * *